(12) United States Patent  (10) Patent No.: US 7,671,437 B2
Rhodes  (45) Date of Patent: Mar. 2, 2010

(54) PHOTOGATE STACK WITH NITRIDE INSULATING CAP OVER CONDUCTIVE LAYER

(75) Inventor: Howard E. Rhodes, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1 day.

(21) Appl. No.: 11/710,987

(22) Filed: Feb. 27, 2007

(65) Prior Publication Data

US 2007/0145512 A1 Jun. 28, 2007

Related U.S. Application Data

(63) Continuation of application No. 10/949,380, filed on Sep. 27, 2004, now abandoned.

(51) Int. Cl.
*H01L 31/06* (2006.01)

(52) U.S. Cl. ..................................... 257/464

(58) Field of Classification Search ................ 257/257, 257/291, 292, E21.185, E21.189, E21.456–E21.458, 257/E21.617, 219, 225, 239, 240, 241, 246, 257/E27.082–E27.083, E27.15–E27.163, 257/E29.065, E29.227–E29.24, E33.076, 257/E31.052–E31.053, 464; 438/60, 75, 438/144
See application file for complete search history.

(56) References Cited

U.S. PATENT DOCUMENTS 6,376,868 B1 * 4/2002 Rhodes ........................ 257/215
6,414,342 B1   7/2002 Rhodes
6,617,623 B2 * 9/2003 Rhodes ........................ 257/215
6,696,314 B2   2/2004 Rhodes
6,930,299 B2   8/2005 Ohkawa
2002/0109157 A1 * 8/2002 Rhodes ........................ 257/222
2002/0109164 A1 * 8/2002 Rhodes ........................ 257/291
2003/0137025 A1   7/2003 Rhodes

FOREIGN PATENT DOCUMENTS

KR   10-0300512   11/2001

OTHER PUBLICATIONS

J. Lee, "Analysis of CMOS Photodiodes, Part I: Quantum Efficiency," IEEE Transactions on Electron Devices, vol. 30, No. 5, pp. 1233, May 2003.
W.H.Lin, et. al "Impacts of Buffered Oxide in Nitride/Oxide Stack Gate Dielectrics on the Device Performance and Dielectric Reliability," Electrochemical and Solid State Letters, vol. 5, pp. F7-F9, 2002.
F. Chen "Photo-Enhanced Negative Differential Resistance and Photo-Accelerated Time-Dependent Dielectric Breakdown in Thin Nitride-Oxide Dielectric Film," Applied Physics Letters, vol. 78, No. 21, pp. 3241-3243 (2001).

* cited by examiner

*Primary Examiner*—Dao H Nguyen
*Assistant Examiner*—Tram H Nguyen
(74) *Attorney, Agent, or Firm*—Dickstein Shapiro LLP

(57) ABSTRACT

A photogate structure having increased quantum efficiency, especially for low wavelength light such as blue light. The photogate is formed of a thin conductive layer, such as a layer of doped polysilicon. A nitride insulating cap is formed over the conductive layer. The nitride layer reduces the reflections at the conductor/insulator interface. A pixel cell incorporating the photogate structure also has a buried accumulation region beneath the photogate. A method of fabricating the photogate structure is also disclosed.

11 Claims, 13 Drawing Sheets

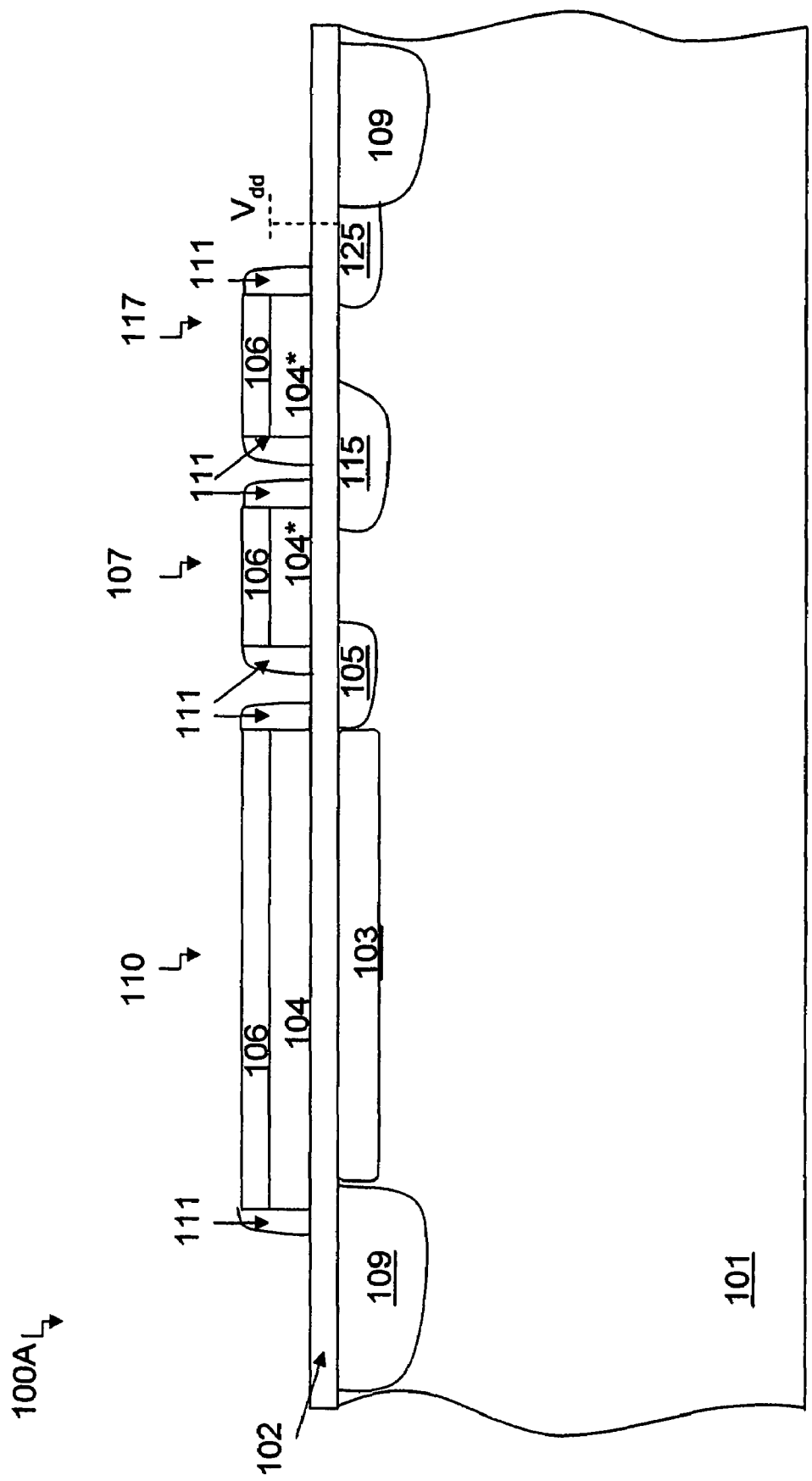

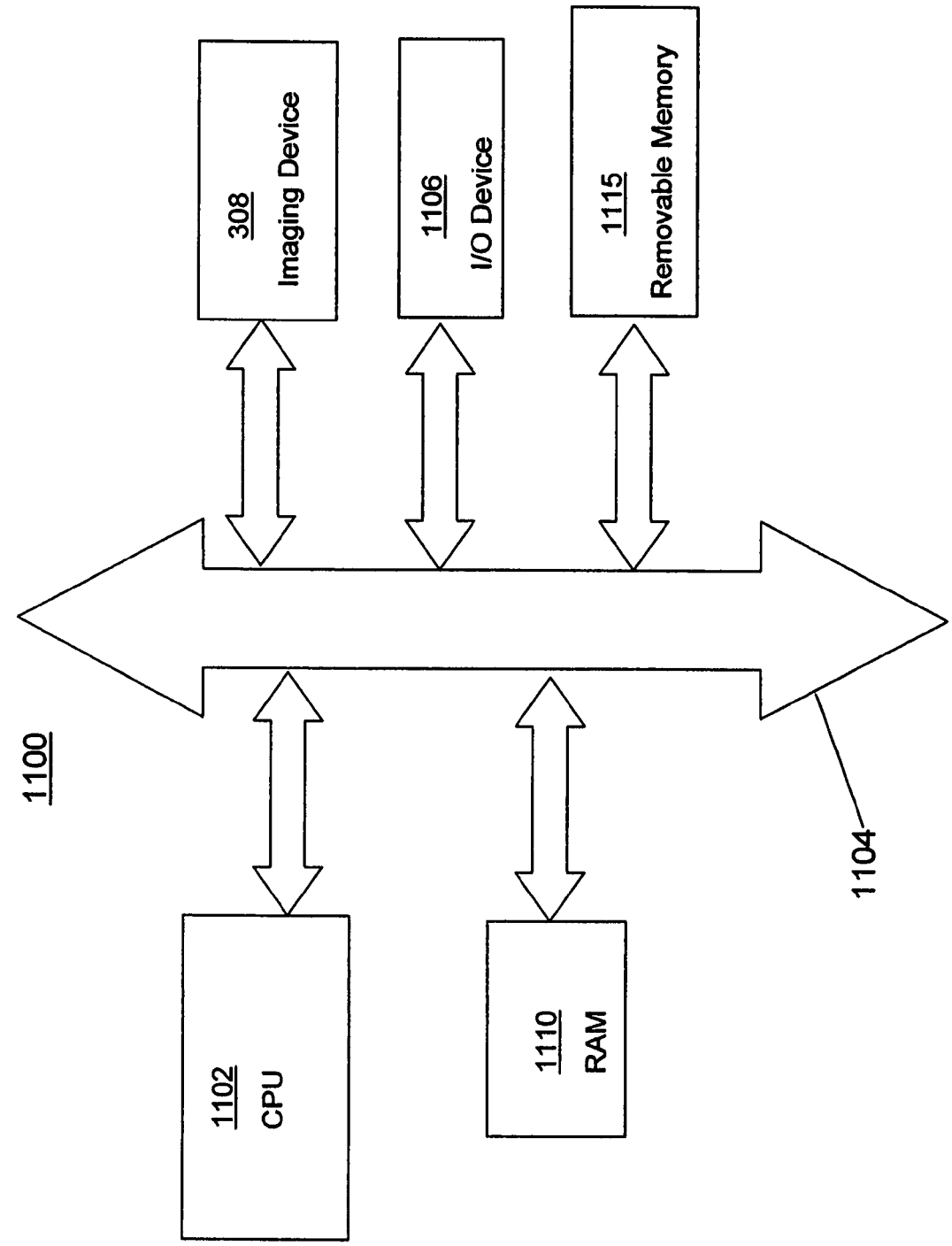

US 7,671,437 B2

PHOTOGATE STACK WITH NITRIDE INSULATING CAP OVER CONDUCTIVE LAYER

This application is a continuation of application Ser. No. 10/949,380, filed Sep. 27, 2004, now abandoned, the subject matter of which is incorporated in its entirely by reference herein.

FIELD OF THE INVENTION

The present invention relates to the field of semiconductor devices and, in particular, to a photogate photosensor. The invention relates to improving the efficiency of photogate structures, especially with regard to low wavelength light.

BACKGROUND OF THE INVENTION

CMOS imagers are increasingly being used as low cost imaging devices. A CMOS imager circuit includes a focal plane array of pixel cells, each one of the cells including a photosensor, for example, a photogate, photoconductor or a photodiode overlying a substrate for accumulating photo-generated charge in the underlying portion of the substrate. A readout circuit is connected to each pixel cell and includes at least a pixel selecting field effect transistor formed in the substrate and a charge storage region formed on the substrate connected to the gate of a transistor coupled to the pixel selecting transistor. The charge storage region may be constructed as a floating diffusion region. The imager may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the necessary functions of: (1) photon to charge conversion; (2) accumulation of image charge; (3) resetting the storage region to a known state before the transfer of charge to it; (4) transfer of charge to the storage region accompanied by charge amplification; (5) selection of a pixel for readout; and (6) output and amplification of a signal representing a reset voltage and a signal representing pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes, all assigned to Micron Technology, Inc. The disclosures of each of the foregoing are hereby incorporated by reference herein in their entirety.

To provide context for the invention, an exemplary CMOS APS (active pixel sensor) cell 10 is described below with reference to FIGS. 1 and 2. FIG. 1 is a top-down view of pixel cell 10; and FIG. 2 is a cross-sectional view of the cell 10, take along line A-A' of FIG. 1. The cell 10 is a four transistor (4T) pixel sensor cell. The illustrated cell 10 shown includes a photodiode 13 formed as a pinned photodiode. Alternatively, the CMOS APS cell 10 may include a photogate, photoconductor or other photon to charge converting device, in lieu of a pinned photodiode 13, as the initial accumulating area for photo-generated charge. The photodiode 13 includes a p+ surface accumulation layer 5 and an underlying n− accumulation region 14 in a p-type semiconductor substrate layer 1.

The cell 10 of FIG. 1 has a transfer gate 7 for transferring photocharges generated in the n− accumulation region 14 to a floating diffusion region 3 (serving as a storage node). The floating diffusion region 3 is further connected to a gate 27 of a source follower transistor. The source follower transistor provides an output signal to a row select access transistor having gate 37 for selectively gating the output signal to a pixel array column line, shown as the out line in FIG. 1. A reset transistor having gate 17 resets the floating diffusion region 3 to a specified charge level before each charge transfer from the n− region 14 of the photodiode 13.

Referring to FIG. 2, the pinned photodiode 13 is formed on a p-type substrate base 1; alternatively, the photodiode 13 can be formed in a p-type epitaxial layer (not shown) grown on a substrate base. It is also possible, for example, to have a p-type substrate base beneath p-wells in an n-type epitaxial layer. The n− accumulation region 14 and p+ accumulation region 5 of the photodiode 13 are spaced between an isolation region 9 and a charge transfer transistor gate 7. The illustrated, pinned photodiode 13 has a p+/n−/p− structure.

The photodiode 13 has two p-type regions 5, 1 having a same potential so that the n− accumulation region 14 is fully depleted at a pinning voltage ($V_{pin}$). The photodiode 13 is termed "pinned" because the potential in the photodiode is pinned to a constant value, $V_{pin}$, when the photodiode 13 is fully depleted. When the transfer gate 7 is conductive, photo-generated charge is transferred from the charge accumulating n− region 14 to the floating diffusion region 3. A complete transfer of charge takes place when a voltage on the floating diffusion region 3 remains above $V_{pin}$ while the pinned photodiode functions at a voltage below $V_{pin}$. An incomplete transfer of charge results in image lag.

The isolation region 9 is typically formed using a conventional shallow trench isolation (STI) process or by using a Local Oxidation of Silicon (LOCOS) process. The floating diffusion region 3 adjacent to the transfer gate 7 is commonly n-type. Translucent or transparent insulating layers, color filters, and lens structures are also formed over the cell 10.

Additionally, impurity doped source/drain regions 32 (FIG. 1), having n-type conductivity, are provided on either side of the transistor gates 17, 27, 37. Conventional processing methods are used to form contacts (not shown) in an insulating layer to provide an electrical connection to the source/drain regions 32, the floating diffusion region 3, and other wiring to connect to gates and form other connections in the cell 10.

Generally, in CMOS pixel cells, such as the cell 10 of FIGS. 1 and 2, incident light causes electrons to collect in the accumulation n− region 14. An output signal produced by the source follower transistor having gate 27 is proportional to the number of electrons extracted from the n− accumulation region 14. The maximum output signal increases with increased electron capacitance or acceptability of the n− region 14 to acquire electrons. In this example, the p+/n− junction dominates the capacitance of the pinned photodiode 13.

Although the conventional p-n-p photodiode 13 has many advantages, one significant drawback associated with the pinned photodiode 13, is that it suffers from a loss of quantum efficiency due to light reflection at the silicon-oxide interface near the surface of the substrate 1. One attempt to overcome this problem is to utilize an anti-reflective coating ("ARC") on the photodiode 13. This proposal, however, requires complicated fabrication methods. For example, if an ARC is put over the pinned photodiode region during fabrication, it must be removed from other circuit elements. If this is done during a spacer etch of transistor gate stacks, then transistor channel hot carrier "CHC" reliability is degraded. If a masked process is used, then an extra mask step is required, which increases the complexity and cost of fabrication.

Conventional photodiodes 13 also suffer from low charge capacity. A proposed alternative to the photodiode 13 is utilizing a photogate as the photosensor. Photogates have increased charge capacity over conventional photodiodes. Photogate photosensors are preferred over photodiodes for some APS imager applications because of their high charge capacity and their ability to achieve charge-to-voltage amplification when combined with a transfer gate. A disadvantage of conventional photogates, however, is poor quantum efficiency for short wavelength light, i.e., wavelengths less than 500 nm, such as green, blue, or violet light. Doped layers of polysilicon, which are typically used to form the photogate, are transparent to long wavelength visible light but attenuate short wavelength light, and is almost opaque to violet light. For example, red light (about 700 nm λ) will penetrate approximately 3,000 nm into room temperature polysilicon, while violet light (about 400 nm λ) will only penetrate approximately 50 nm.

There is needed, therefore, an improved pixel photosensor having increased charge capacity, and also an increased quantum efficiency for low wavelength light. A simple method of fabricating a pixel photosensor exhibiting these improvements is also needed.

BRIEF SUMMARY OF THE INVENTION

Exemplary embodiments of the invention provide a photogate structure having increased quantum efficiency, especially to low wavelength light such as blue light. The photogate is formed of a thin conductive layer, such as a layer of doped polysilicon. A nitride insulating cap is formed over the conductive layer. The nitride layer reduces the reflections at the conductor/insulator interface. A pixel cell incorporating the phototogate structure also has a buried accumulation region beneath the photogate. A method of fabricating the photogate structure is also disclosed.

BRIEF DESCRIPTION OF THE DRAWINGS

The foregoing and other aspects of the invention will be better understood from the following detailed description of the invention, which is provided in connection with the accompanying drawings, in which:

FIG. 3A is a cross-sectional view of another exemplary CMOS pixel cell according to another embodiment of the invention;

FIG. 12 illustrates a computer processor system incorporating a CMOS imager device containing one or more exemplary pixel cells according to the present invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a portion of a representative pixel is illustrated in the figures, and description herein, and typically fabrication of all pixels in an imager array will proceed simultaneously in a similar fashion. The term "short wavelength light" is used as a generic term to refer to electromagnetic radiation having a wavelength within the range of approximately 385 to approximately 550 nm, which includes green-blue, blue, indigo, and violet light. The following detailed description is, therefore, not to be taken in a limiting sense, and the scope of the present invention is defined by the appended claims.

Figure 1:
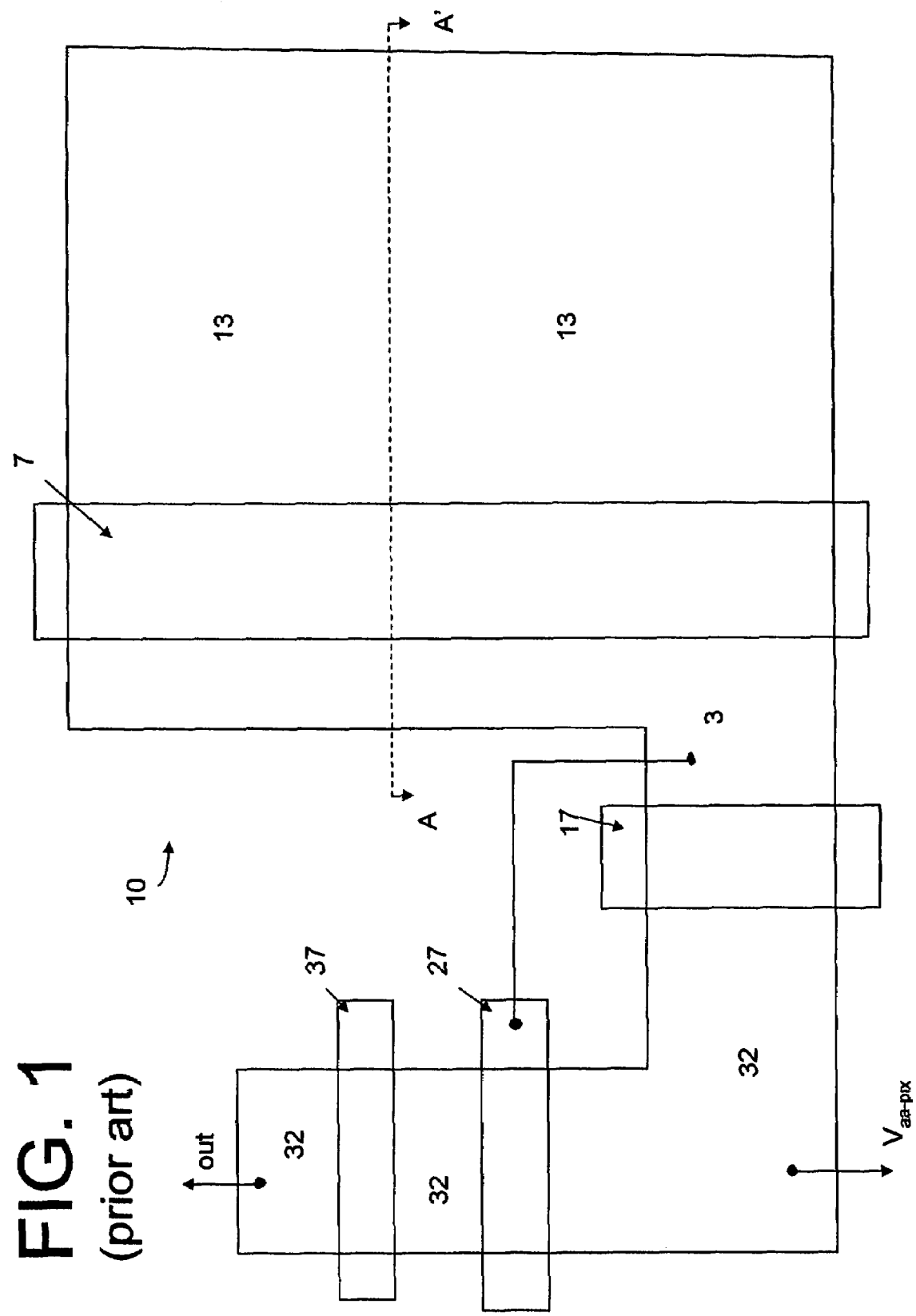
FIG. 1 is a top plan view of a conventional CMOS pixel cell.
Figure 2:
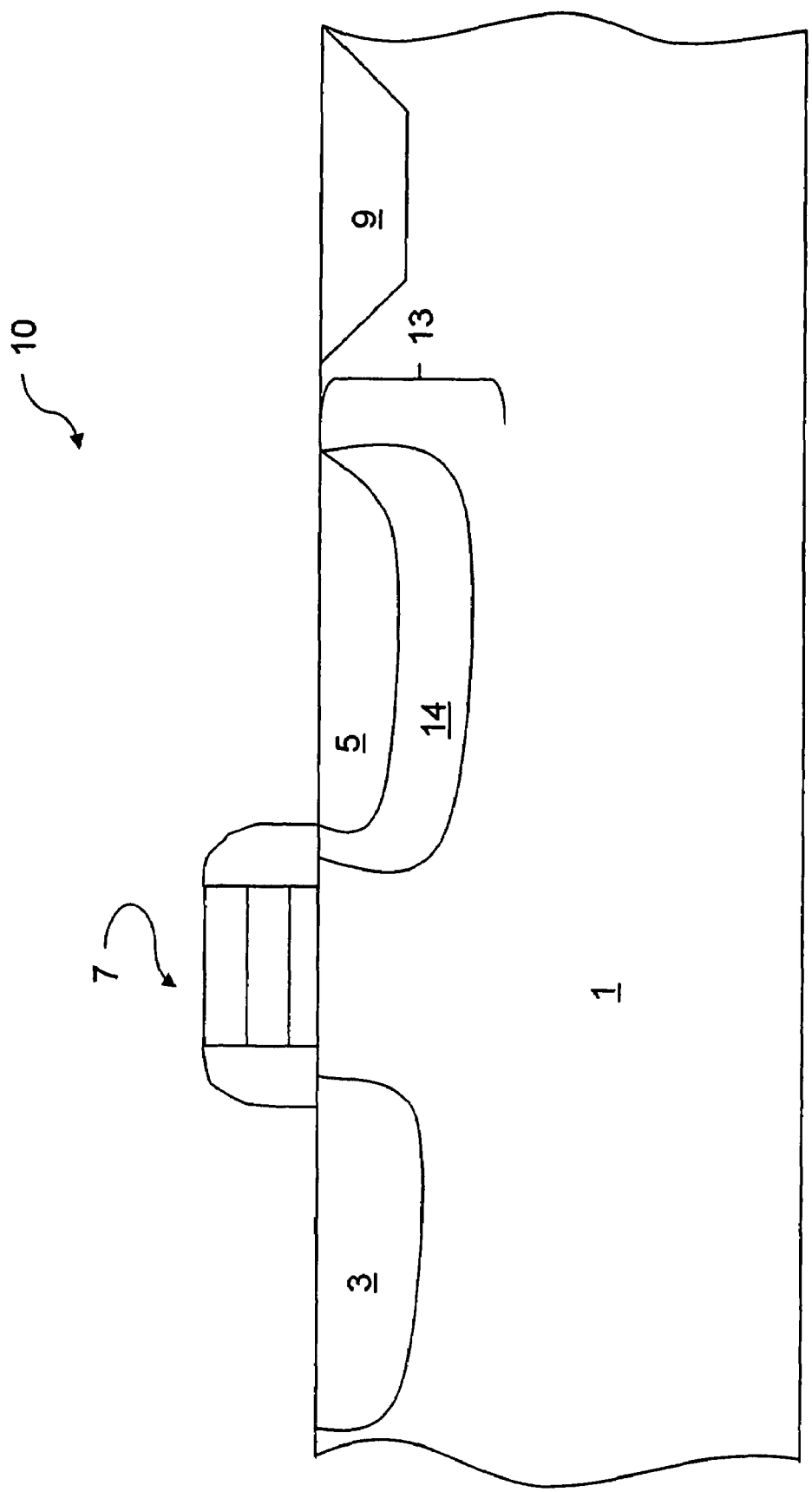
FIG. 2 is a cross-sectional view of the conventional CMOS pixel cell of FIG. 1, taken along line A-A'.
Figure 3:
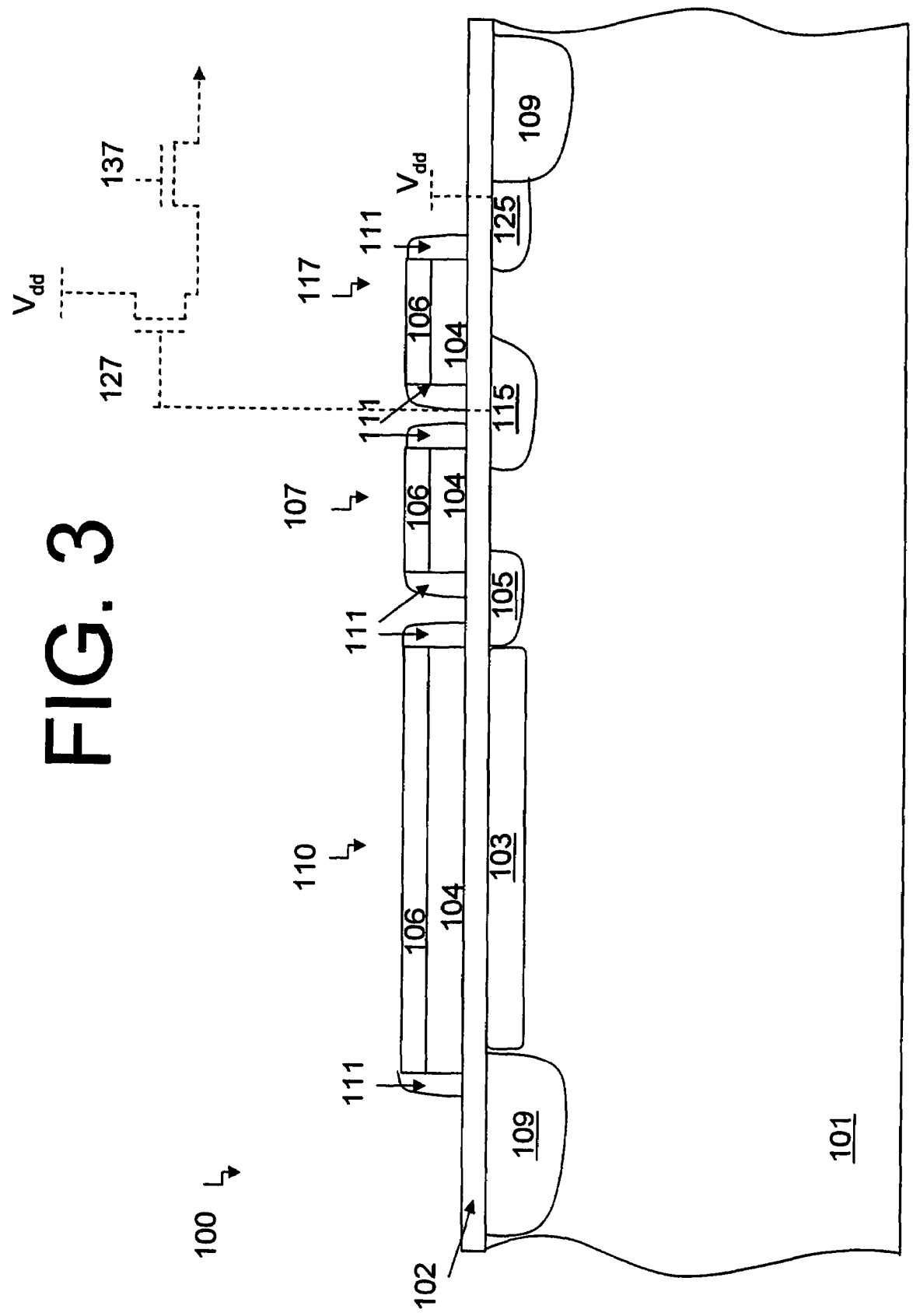
FIG. 3 is a cross-sectional view of an exemplary CMOS pixel cell according to an embodiment of the present invention.

Turning now to the drawings, where like elements are designated by like reference numerals, FIG. 3 illustrates an exemplary pixel cell 100, in accordance with an exemplary embodiment of the present invention.

The exemplary pixel cell 100 has a photogate structure 110 that acts as a photosensor for the pixel cell 100. For exemplary purposes, the pixel cell 100 is formed in a p-type substrate 101. Located in the substrate 101 are four doped regions 103, 105, 115, 125, each illustratively being doped n-type. The first doped region 103 is located beneath the photogate structure 110. A transfer transistor 107 and a reset transistor 117 are illustrated on the pixel cell 100. The transfer transistor 107 transfers charges from the first and second doped regions 103, 105 to a storage region 115. The second doped region 105 is located beneath and between the photogate structure 110 and the transfer transistor 107, thus the doped region 105 serves as the connecting diffusion region between the photogate 110 and the gatestack for the transfer transistor 107. A second transistor, reset transistor 117, resets the charges in the storage region 115 to a reset value when activated. The third doped region 115 is located beneath and between the transfer transistor 107 and the reset transistor 117. The third doped region 115 is a floating diffusion region. The fourth doped region 125, is located partially beneath the reset transistor 117 gate and adjacent the gate side opposite the floating diffusion region 115. The fourth doped region 125 acts as the drain for the reset transistor 117, and is also connected to voltage source Vdd.

Figure 11:
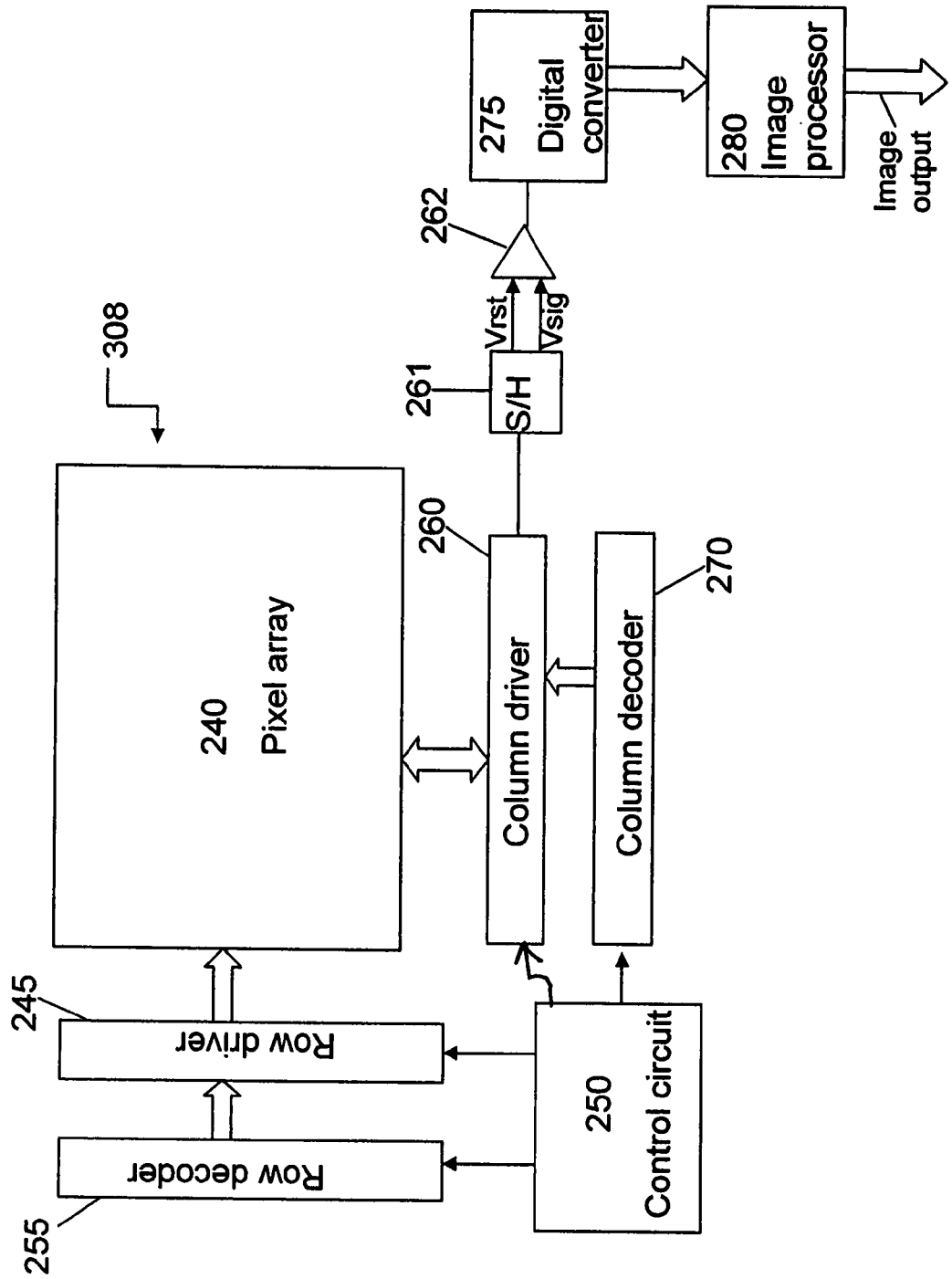
FIG. 11 is a block diagram of an integrated circuit that includes an array with an exemplary pixel cell formed according to the present invention.

Additionally, shallow trench isolation regions 109 are located on each side of the pixel cell 100 and are used to isolate the pixel cell 100 from neighboring cells when incorporated into a pixel array 240 (FIG. 11). Pixel cell 100 also includes a source follower transistor 127 and a row select transistor 137 which are used to output a signal from pixel cell 100 representing the amount of light being applied to the pixel cell 100. Transistors 127, 137 are coupled in series, source to drain, with the drain of the source follower transistor 127 also coupled to a voltage source $V_{dd}$ and the source of the row select transistor 137 used to selectively connect the pixel cell 100 to readout circuitry.

Each of the photogate 110, the transfer transistor 107, and the reset transistor 117 are made up of at least three stacked layers 102, 104, 106. A thin layer of oxide forms an insulating layer 102 at the surface of the substrate 101. The oxide insulating layer 102 may consist of any suitable insulating material, such as silicon dioxide. A conductive layer 104 is located over the insulating layer 102. The conductive layer 104 may be any suitable conductive material that is transparent to radiant energy, including but not limited to doped polysilicon or indium-tin oxide. The conductive layer 104 has a thickness of about 100 Angstroms to about 1500 Angstroms, and in a preferred embodiment, the conductive layer 104 is a layer of doped polysilicon, preferably about 600 Angstroms thick. A second insulating layer 106 is located over the conductive layer 104. The second insulating layer is approximately 500 Angstroms to about 2000 Angstroms thick. In accordance with the present invention, the second insulating layer 106 contains a nitride. In a preferred embodiment, the second insulating layer 106 is an NO (nitride/oxide) layer, approximately 1000 Angstroms in thickness of nitride under 1000 Angstroms of oxide. Each of the gatestacks just described (for the photogate 110, and the transfer 107 and reset 117 transistors), also has insulating sidewalls 111 formed on either side of the gatestack. The sidewalls 111 may be formed of any suitable material, including but not limited to silicon dioxide, silicon nitride, silicon oxyntiride, ON, NO, or ONO.

In an alternative embodiment, shown in FIG. 3A, the gatestacks of the transfer 107 and reset 117 transistors have a conductive layer 104* that is different than the conductive layer 104 of the photogate structure 110. It may be advantageous for the transfer and reset gate conductors 104* to be composed of highly conductive materials in order to improve the circuit speed of the cell 100A by reducing the resistance of the gate conductor. Any suitable, highly conductive material may be selected for the gate conductor layer 104* as is known in the art and need not necessarily be transparent, like the conductive layer 104. However, for designs where circuit speed is not a limiting factor, the transfer 107 and reset 117 transistor gate conductors should be made of the same material as the conductive layer 104 of the photogate structure 110 in order to simplify the fabrication process flow.

Figure 4:
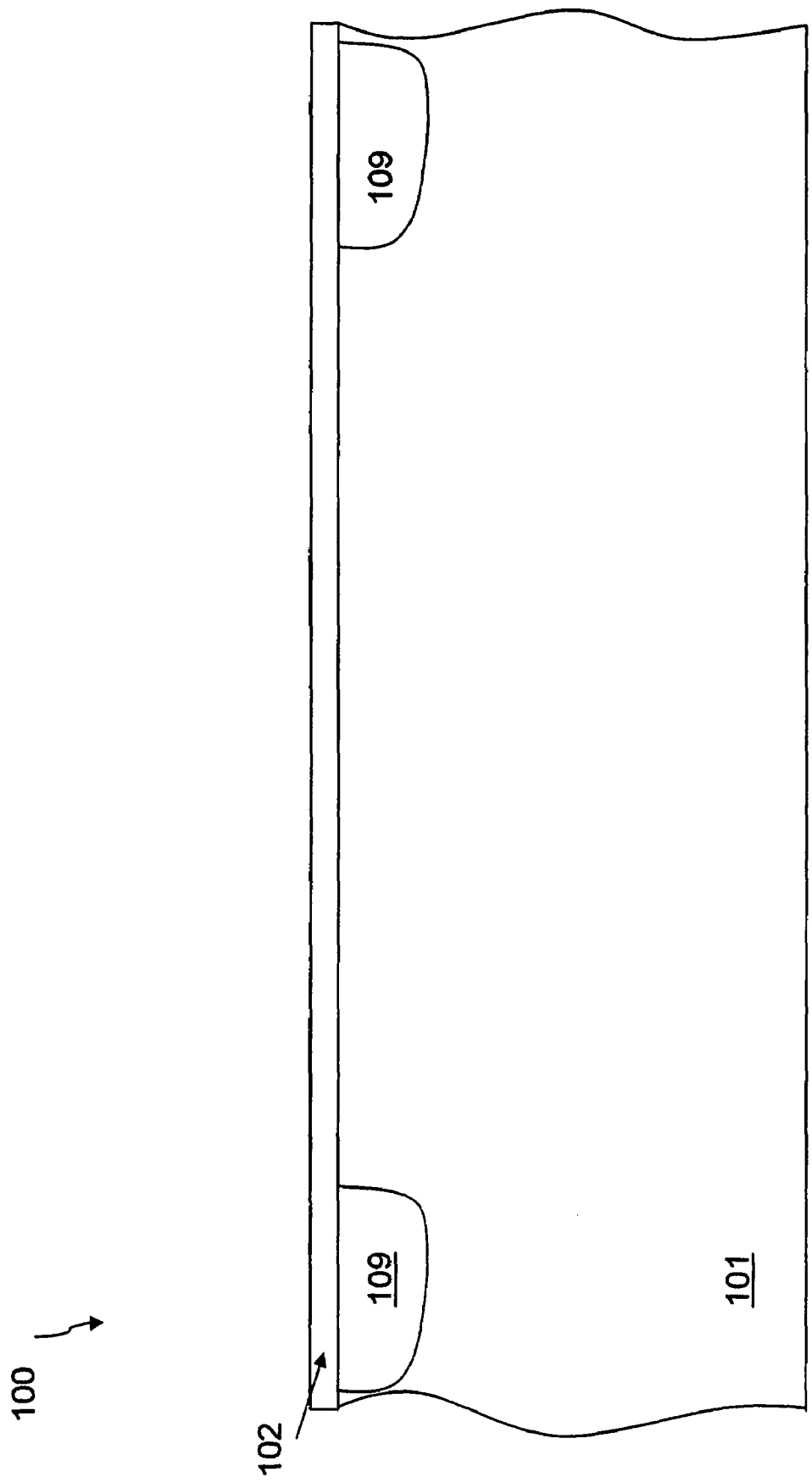
FIG. 4 is a cross-sectional view of the exemplary CMOS pixel cell of FIG. 3 at an initial stage of fabrication.

The pixel cell 100 is fabricated through a process described as follows, and illustrated by FIGS. 4 through 8. Referring now to FIG. 4, a substrate 101, which may be any of the substrates describe above, is doped to a first conductivity type. Alternatively, a doped substrate layer or well may be formed in or over the substrate 101, in which the rest of the fabrication steps are completed. Insulating regions, illustratively STI regions 109, are formed in the area around the cell 100 using conventional STI processes. A gate insulating layer 102 is formed over the surface of the substrate 101. The insulating layer 102 may be formed using thermal growth to form a layer of silicon dioxide or any other suitable technique. If, however, the transfer 107 and reset 117 transistor gatestacks are constructed as illustrated in FIG. 3A, the formation of these gatestacks would be fabricated before insulating layer 102 is formed. The gatestacks may be formed using any conventional transistor fabrication techniques known in the art.

Figure 5:
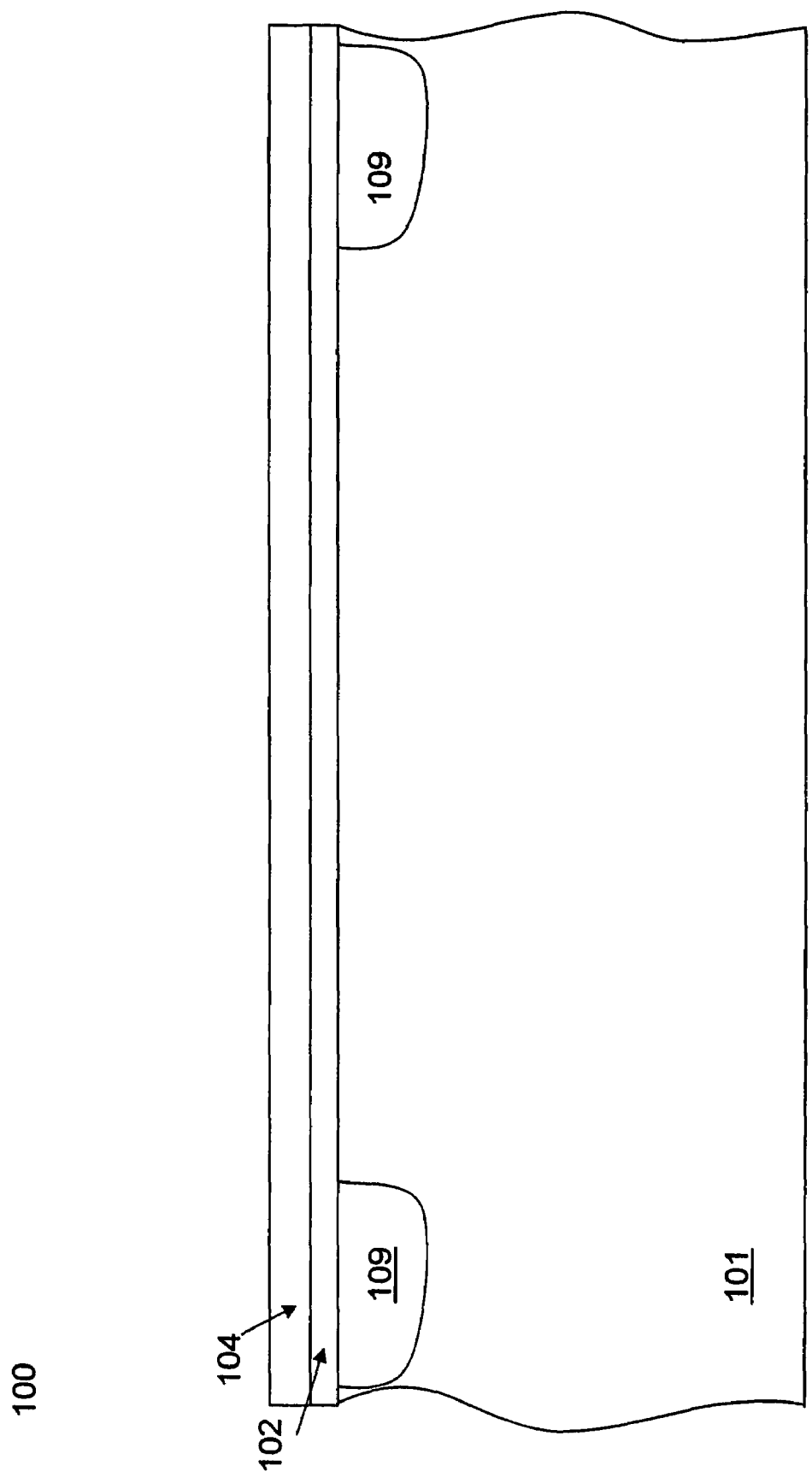
FIG. 5 is a cross-sectional view of the exemplary CMOS pixel cell of FIG. 3 at a stage of fabrication subsequent to FIG. 4.
Figure 6:
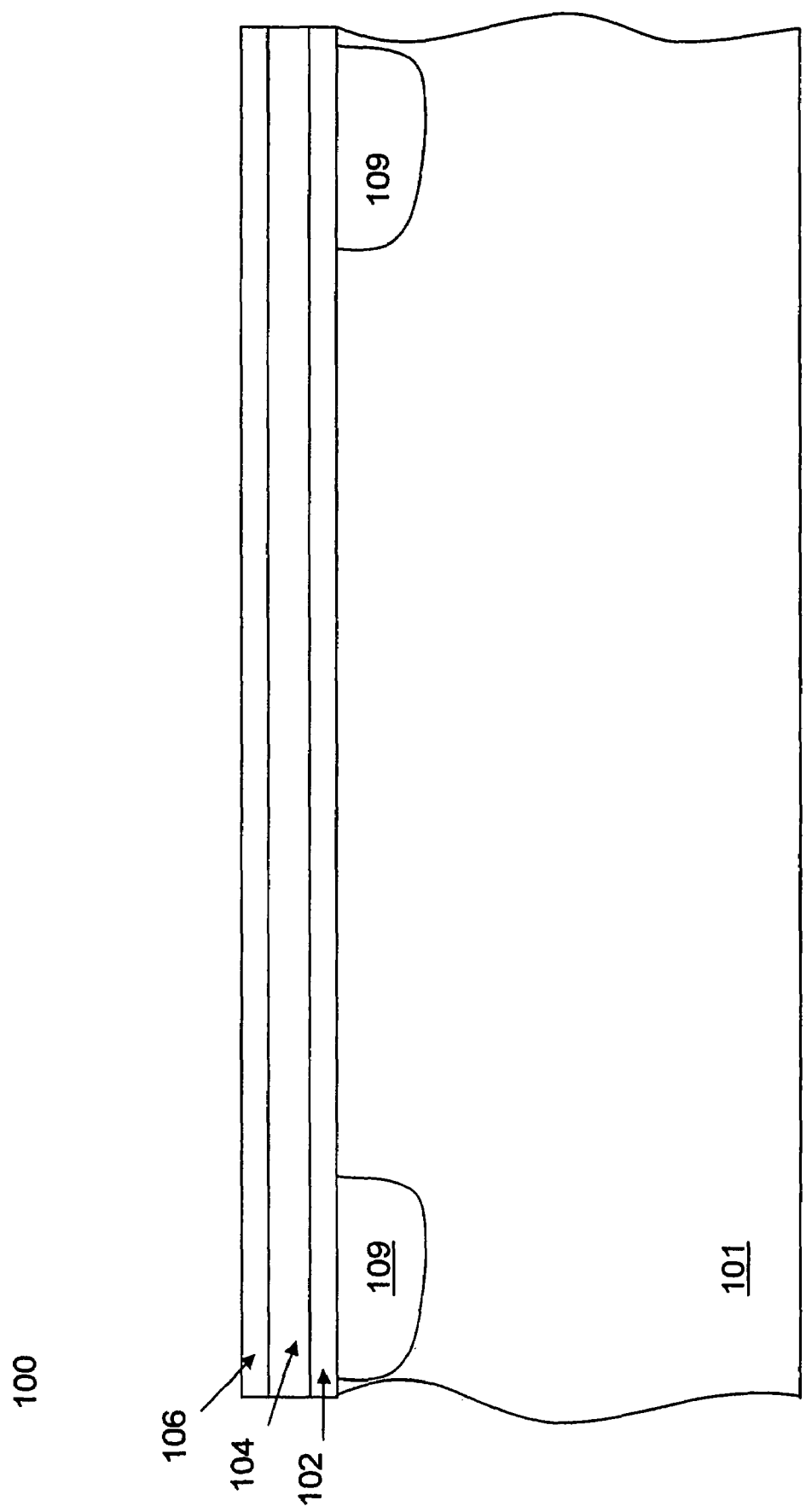
FIG. 6 is a cross-sectional view of the exemplary CMOS pixel cell of FIG. 3 at a stage of fabrication subsequent to FIG. 5.

Next, referring to FIG. 5 and assuming that the conductor of the transistor gate stacks at that of the photogate will be formed of the same material, the transparent conductive layer 104 is formed over the insulating layer 102. The conductive layer 104 may be formed using CVD, or other suitable means. The second insulating layer 106 is formed over the conductive layer 104 as shown in FIG. 6. In a preferred embodiment, the second insulating layer 106 is a nitride/oxide sandwich structure. This preferred embodiment is accomplished depositing a nitride layer to a thickness of about 1000 Angstrom over an oxide layer, which is also about 1000 Angstroms thick.

Figure 7:
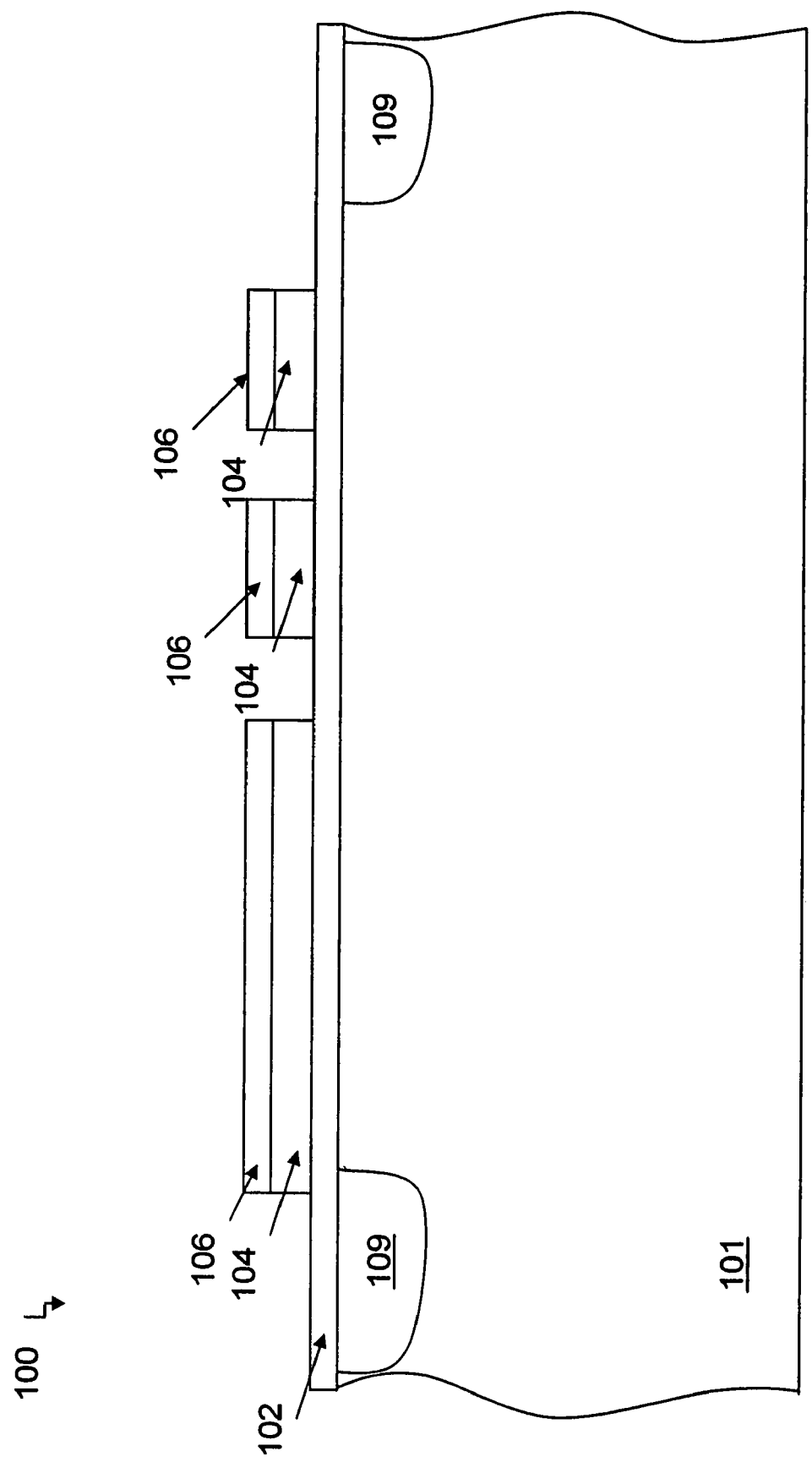
FIG. 7 is a cross-sectional view of the exemplary CMOS pixel cell of FIG. 3 at a stage of fabrication subsequent to FIG. 6.
Figure 8:
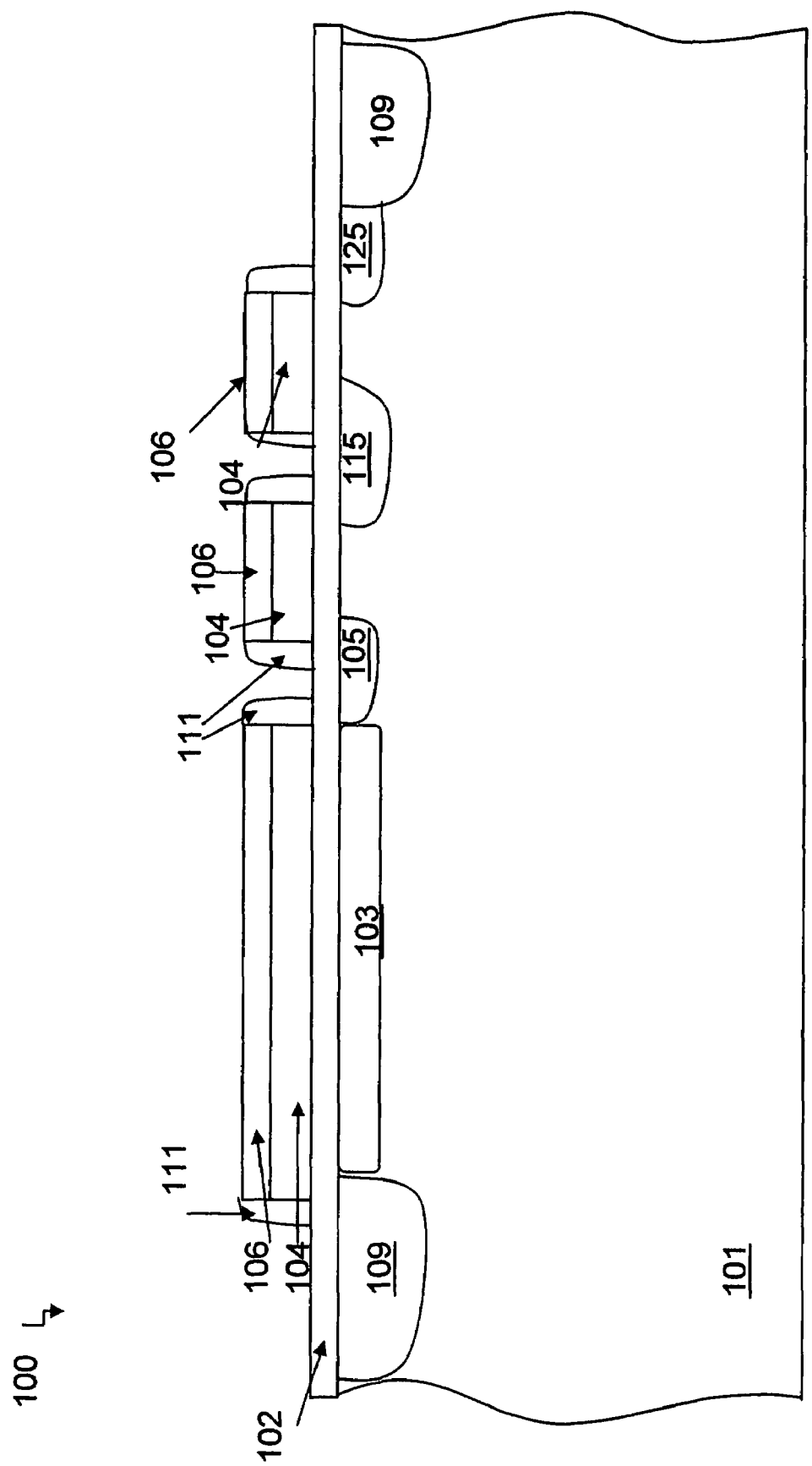
FIG. 8 is a cross-sectional view of the exemplary CMOS pixel cell of FIG. 3 at a stage of fabrication subsequent to FIG. 7.

Referring to FIG. 7, a resist/etching step is performed to shape the photogate 110 and the gates of other transistors 107, 117, 127, and 137, as desired. At this time, portions of layer 102 may also be removed from other areas of the pixel cell 100. Next, as shown in FIG. 8, the substrate 101 is doped using a resist and mask (not shown) to shield areas of the substrate 101 that are not to be doped. Four doped regions: 103, 105 (connecting diffusion), 115 (floating diffusion) and 125 (drain), are formed, which may be performed in as few as one step. The doping level of the doped regions 103, 105, 115, and 125 may be controlled and may vary as desired. For example, multiple masks and resists may be used to dope these regions to varied concentrations. Doped regions 115 and 125 are preferably strongly doped, illustratively n+ type. The second doped region 105 (connecting diffusion) is most likely to be lightly doped n-type, and thus, may need to be masked when performing a second doping step to provide more dopant to regions 115 and 125.

With reference back to FIG. 3, insulating sidewalls 111 are then formed on each gatestack by blanket deposition of spacer material and an etch back. The sidewalls 111 may be formed of any suitable material including e.g., nitride, oxide, and oxynitride and are also shown in FIG. 8. At this stage, the pixel cell 100 of the first embodiment is essentially complete. Additional conventional processing methods may then be used to form contacts and wiring to connect gate lines and other connections in the pixel cell 100. For example, the entire surface may then be covered with a passivation layer of e.g., silicon dioxide, BSG, PSG, or BPSG, which is CMP planaraized and etched to provide contact holes, which are then metallized to provide contacts to source/drain regions adjacent to the gates. Conventional metallization and ILD layers may be used to interconnect the structures as desired and to periphery circuits.

Figure 9:
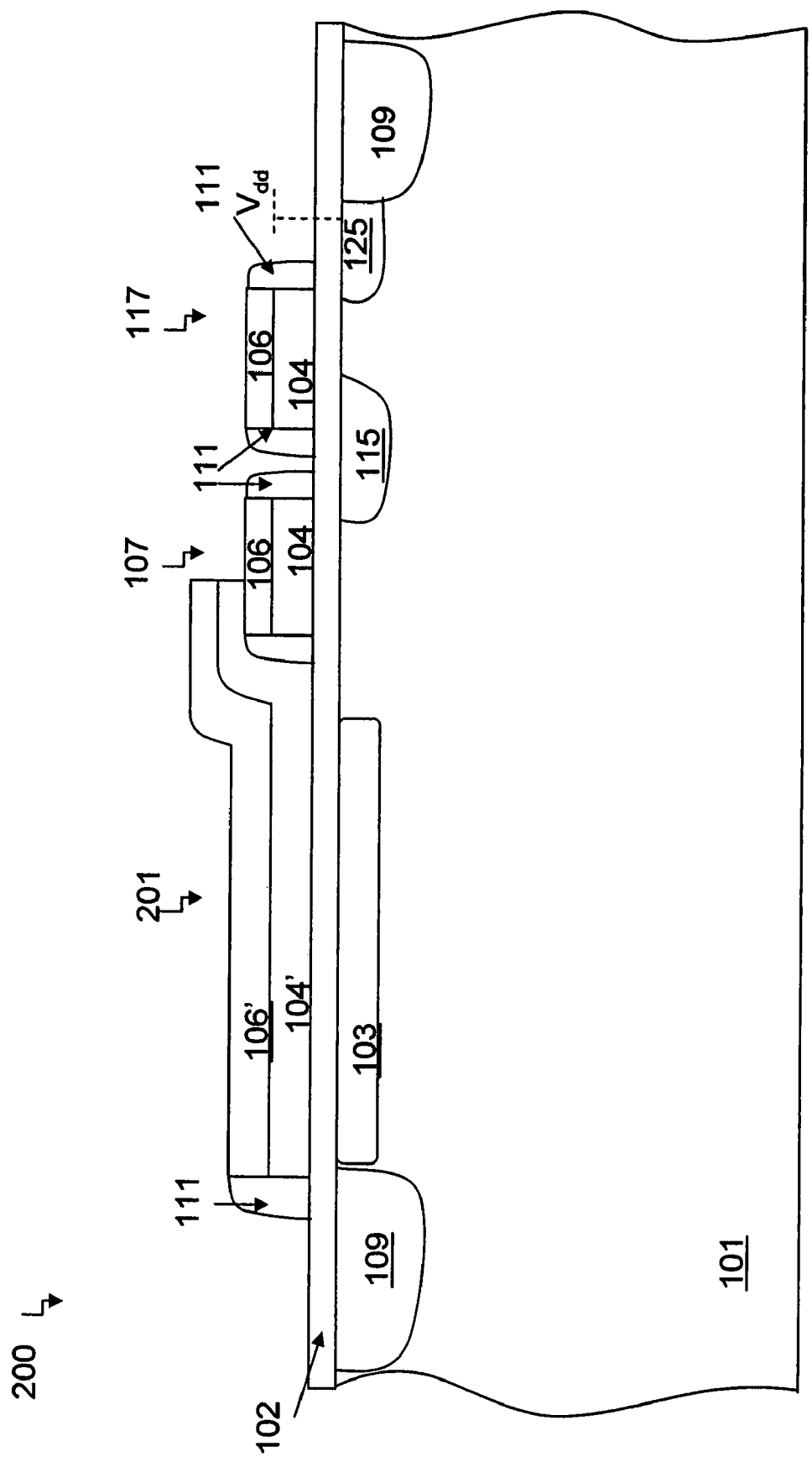
FIG. 9 is a cross-sectional view of an exemplary CMOS pixel cell according to another exemplary embodiment of the present invention.

FIG. 9 shows a pixel cell 200 constructed in accordance with another exemplary embodiment of the invention. The pixel cell 200 is similar to exemplary pixel cell 100 except that it has a photogate structure 201 that overlaps the gatestack of the transfer transistor 107. When the photogate structure 110 and the transfer transistor 107 overlap, a connecting diffusion region 105 (FIG. 3) is not necessary, as the overlapping photogate 201 and transistor gate 107 structures are capable of operating to transfer charge from region 103 to region 115. Pixel cell 200 is fabricated in a similar manner to the method described above and illustrated in FIGS. 4-8, with a few exceptions. The gatestack for transfer transistor 107 lies under the photogate 201; accordingly the gatestack for transistor 107 must be formed before the layers for the photogate 201 are formed. Additionally, in the doping of the substrate, only three areas, 103, 115, and 125 are created because the connecting diffusion region 105 is not necessary for reasons just described.

Figure 10:
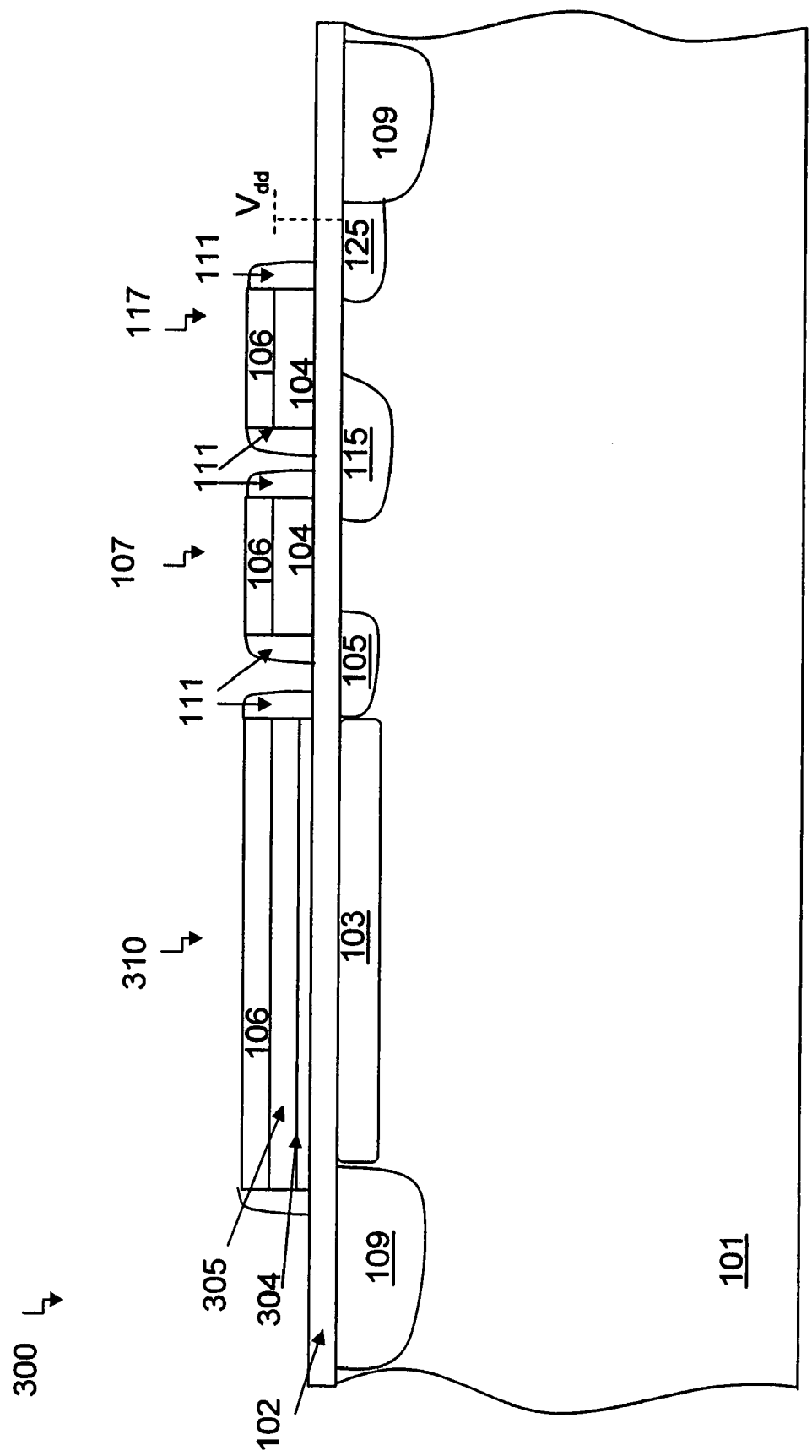
FIG. 10 is a cross-sectional view of an exemplary CMOS pixel cell according to yet another exemplary embodiment of the present invention.

FIG. 10 depicts a pixel cell 300 constructed in accordance with yet another exemplary embodiment of the invention. The pixel cell 300 is similar to exemplary pixel cell 100 except that it has a photogate structure 310 that has a dual-conductor design. The photogate structure 310 of this embodiment includes a thin doped silicon layer 304, such as polysilicon beneath a top conductive layer 305 which is transparent to radiant energy. Suitable materials for the top conductive layer 305 include indium tin oxide ($In_xSn_yO_z$), indium oxide ($In_2O_3$), or tin oxide ($SnO_2$). The polysilicon layer 304 is preferably very thin, with the range of about 100 Angstroms to about 1000 Angstroms thick. The top conductive layer 305 has a thickness within the range of about 100 Angstroms to about 2000 Angstroms thick. The top conductive layer 305 helps to decrease the sheet resistance of the photogate structure 310, and is therefore useful in applications where sheet resistance is of concern. The photogate structure 310 also has a nitride insulating cap 106, fabricated as discussed above for exemplary pixel cell 100. In fact, fabrication of pixel cell 300 may be done as described above with reference to FIGS. 4-8, adding one additional step for the forming of the second conductive layer 305.

It should be appreciated that the invention is not limited to the exemplary embodiments just described. For example, a pixel cell having the photogate construction of FIG. 10 can at least partially overlap transfer transistor gate structure 107 in the manner shown in FIG. 9 with the omission of region 105.

FIG. 11 illustrates a block diagram of an exemplary CMOS imager 308 having a pixel array 240 comprising a plurality of pixels arranged in a predetermined number of columns and rows, with each pixel cell being constructed as in one of the illustrated embodiments described above. Attached to the array 240 is signal processing circuitry, as described herein, at least part of which may be formed in the substrate. The pixels of each row in array 240 are all turned on at the same time by a row select line, and the pixels of each column are selectively output by respective column select lines. A plurality of row and column lines are provided for the entire array 240. The row lines are selectively activated by a row driver 245 in response to row address decoder 255. The column select lines are selectively activated by a column driver 260 in response to column address decoder 270. Thus, a row and column address is provided for each pixel.

The CMOS imager is operated by the timing and control circuit 250, which controls address decoders 255, 270 for selecting the appropriate row and column lines for pixel readout. The control circuit 250 also controls the row and column driver circuitry 245, 260 such that they apply driving voltages to the drive transistors of the selected row and column lines. The pixel column signals, which typically include a pixel reset signal ($V_{rst}$) and a pixel image signal ($V_{sig}$), are read by a sample and hold circuit 261. $V_{rst}$ is read from a pixel 100, 200, 300 immediately after the diffusion region 115 is reset by the reset gate 117. $V_{sig}$ represents the amount of charges generated by the photogate 110, 201, 310 in response to applied light to the pixel cell 100, 200, 300. A differential signal ($V_{rst}-V_{sig}$) is produced by differential amplifier 262 for each pixel, which is digitized by analog-to-digital converter 275 (ADC). The analog to digital converter 275 supplies the digitized pixel signals to an image processor 280 which forms and outputs a digital image.

FIG. 12 illustrates a processor-based system 1100 including an imaging device 308, which has pixels constructed in accordance with the methods described herein. For example, pixels may be any of the exemplary pixel cells 100, 100A, 200, 300 constructed in accordance with the exemplary embodiments of the invention described above. The processor-based system 1100 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

The processor-based system 1100, for example a camera system, generally comprises a central processing unit (CPU) 1102, such as a microprocessor, that communicates with an input/output (I/O) device 1106 over a bus 1104. Imaging device 308 also communicates with the CPU 1102 over the bus 1104, and may include a CMOS pixel array having any one of the exemplary pixels 100, 100A, 200, 300 as discussed above. The processor-based system 1100 also includes random access memory (RAM) 1110, and can include removable memory 1115, such as flash memory, which also communicates with CPU 1102 over the bus 1104. Imaging device 308 may be combined with a processor, such as a CPU, digital signal processor, or microprocessor, with or without memory storage on a single integrated circuit or on a different chip than the processor. Any of the memory storage devices in the processor-based system 1100 could store software for employing the above-described method.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A photosensor for use in an imaging device, said photosensor comprising:
   a doped region formed in a substrate for accumulating photo-charges;
   a doped polysilicon layer provided over said doped region;
   a transparent conductive layer formed over the doped polysilicon layer; and
   a nitride layer provided over said transparent conductive layer,
   wherein the doped polysilicon layer, the transparent conductive layer and the nitride layer form a gatestack disposed between insulating sidewalls formed on either side of the gatestack.

2. The photosensor of claim 1, wherein the transparent conductive layer is comprised of one of indium tin oxide, indium oxide, and tin oxide.

3. The photosensor of claim 1, wherein said doped polysilicon layer has a thickness of about 100 to 1000 Angstroms.

4. The photosensor of claim 1, wherein the transparent conductive layer has a thickness of about 100 Angstroms to about 2000 Angstroms.

5. The photosensor of claim 1, wherein said nitride layer has a thickness of about 500 to 1500 Angstroms.

6. The photosensor of claim 5, wherein said nitride layer has a thickness of about 1000 Angstroms.

7. The photosensor of claim 1, wherein:
the doped polysilicon layer has a thickness of about 100 to 1000 Angstroms;
the transparent conductive layer has a thickness of about 100 Angstroms to about 2000 Angstroms; and
said nitride layer has a thickness of about 500 to 1500 Angstroms.

8. The photosensor of claim 7, wherein said nitride layer has a thickness of about 1000 Angstroms.

9. The photosensor of claim 7, wherein the transparent conductive layer is comprised of one of indium tin oxide, indium oxide, and tin oxide.

10. An array of pixel sensor cells comprising:
a plurality of pixel cells formed in a substrate, each cell comprising:
a photogate for generating and accumulating photo-charges, said photogate comprising:
a doped polysilicon layer provided over a first doped region in the substrate,
a transparent conductive layer provided over the doped polysilicon layer, and
a nitride layer provided over said transparent conductive layer,
wherein the doped polysilicon layer, the transparent conductive layer and the nitride layer form a gatestack disposed between insulating sidewalls formed on either side of the gatestack; and
a transistor for transferring the accumulated photo-charges to a second doped region in the substrate.

11. The array of pixel cells of claim 10, wherein said transparent conductive layer comprises at least one of indium tin oxide, indium oxide, and tin oxide.

* * * * *